United States Patent
Li et al.

(10) Patent No.: US 10,245,767 B2
(45) Date of Patent: Apr. 2, 2019

(54) MEMBRANE FOR LIQUID-RESISTANT DEVICES AND METHODS OF MAKING A MEMBRANE

(71) Applicant: Apple Inc., Cupertino, CA (US)

(72) Inventors: Xuesen Li, Cupertino, CA (US); Tyler S. Bushnell, Mountain View, CA (US); Christopher M. Werner, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/368,307

(22) Filed: Dec. 2, 2016

(65) Prior Publication Data

US 2017/0181303 A1    Jun. 22, 2017

Related U.S. Application Data (60) Provisional application No. 62/270,503, filed on Dec. 21, 2015.

(51) Int. Cl.
*H05K 7/00* (2006.01)
*B29C 45/14* (2006.01)
(Continued)

(52) U.S. Cl.
CPC .... *B29C 45/14336* (2013.01); *B29C 45/1671* (2013.01); *B29C 45/2618* (2013.01); *G01L 9/0044* (2013.01); *H04R 1/44* (2013.01); *H04R 31/003* (2013.01); *B29C 2045/14131* (2013.01); *B29K 2463/00* (2013.01); *B29K 2627/18* (2013.01); *B29K 2995/0065* (2013.01); *B29K 2995/0069* (2013.01); *B29L 2031/3481* (2013.01); *H04R 7/20* (2013.01); *H04R 2231/001* (2013.01); *H04R 2307/025* (2013.01); *H04R 2307/204* (2013.01); *H05K 7/00* (2013.01)

(58) Field of Classification Search
None
See application file for complete search history.

(56) References Cited

U.S. PATENT DOCUMENTS

| | | | |
|---|---|---|---|
| 7,166,024 B2 * | 1/2007 | Mashiko | F21S 48/335 454/270 |
| 7,464,814 B2 * | 12/2008 | Carnevali | G06F 1/1626 206/320 |

(Continued)

*Primary Examiner* — Courtney Smith
*Assistant Examiner* — Rashen E Morrison
(74) *Attorney, Agent, or Firm* — Dickinson Wright RLLP (57) ABSTRACT

A bracket assembly suitable for use with an electronic device is described. The bracket assembly may include a bracket body having a channel. The bracket assembly may further include a membrane embedded in the bracket body and designed to allow air, but not liquid (such as water), to pass through the membrane. The membrane may be at least partially surrounded by a membrane support molded to the membrane. The membrane and the membrane support may be disposed in a molding tool to receive a material used to mold the bracket body over the membrane and the membrane support. During the molding operation, the membrane support may act as a buffer to shield the membrane from temperature and pressure increases associated with the molding operation of the bracket body. The bracket assembly may improve the ability of the electronic device to prevent liquid ingress.

19 Claims, 11 Drawing Sheets

(51) Int. Cl.
*B29C 45/26* (2006.01)
*B29C 45/16* (2006.01)
*G01L 9/00* (2006.01)
*H04R 1/44* (2006.01)
*H04R 31/00* (2006.01)
*B29L 31/34* (2006.01)
*B29K 627/18* (2006.01)
*B29K 463/00* (2006.01)
*H04R 7/20* (2006.01)

(56) References Cited

U.S. PATENT DOCUMENTS

| | | | | |
|---|---|---|---|---|
| 2004/0089570 | A1* | 5/2004 | Chien | H04M 1/18 206/320 |
| 2009/0047890 | A1* | 2/2009 | Yano | B65D 77/225 454/143 |
| 2010/0096284 | A1* | 4/2010 | Bau | H04B 1/3888 206/320 |
| 2010/0206601 | A1* | 8/2010 | Choraku | H04M 1/0249 174/50.5 |
| 2013/0265715 | A1* | 10/2013 | Bae | H04M 1/18 361/679.55 |

* cited by examiner

MEMBRANE FOR LIQUID-RESISTANT DEVICES AND METHODS OF MAKING A MEMBRANE

CROSS-REFERENCE TO RELATED APPLICATION(S)

This application claims the benefit of priority under 35 U.S.C. § 119(e) to U.S. Provisional Application No. 62/270,503, filed on Dec. 21, 2015, and titled "MEMBRANE FOR LIQUID-RESISTANT DEVICES AND METHODS OF MAKING A MEMBRANE," the disclosure of which is incorporated herein by reference in its entirety.

FIELD

The described embodiments relate to an electronic device having water-resistant features. In particular, the described embodiments describe a membrane used to prevent liquid ingress at an opening of the electronic device. The membrane may include air-permeable characteristics, while also including liquid-resistant characteristics. The membrane may allow air to enter or pass, thereby allowing an audio driver installed in the electronic device to emit audible sound from the electronic device. The membrane may also be used to equilibrate the electronic device with respect to the external environment when, for example, the electronic device changes pressure due to increased or decreased elevation.

BACKGROUND

An electronic device may include one or more openings to enhance the functionality of the electronic device. For example, an opening may be used to receive an audio jack or to allow an audio speaker to pass audible sound through the electronic device. However, the openings allow an liquid ingress path into the electronic device. To overcome this issue, a screen may be disposed in the opening.

However, the screen may include several drawbacks. For example, the screen may include a relatively delicate material susceptible to damage during assembly (or sub-assembly) of the electronic device. Any damage or mishandling of the screen during manufacturing may limit the screen's ability to withstand liquid ingress, particularly when the liquid exerts a relatively high pressure to the screen. For example, when the electronic device is exposed to water, the screen may break down at greater depths (of the water).

SUMMARY

In one aspect, a bracket assembly for preventing liquid ingress is described. The bracket assembly may include a bracket body that includes a through hole. The bracket assembly may further include a membrane carried by the bracket body and at least partially sealing the through hole such that a liquid is prevented from passing through the through hole. However, the membrane may allow air to pass through the through hole.

In another aspect, an electronic device is described. The electronic device may include an enclosure that includes an internal region. The enclosure may further include a sidewall and an opening extending through the sidewall. The electronic device may further include a bracket assembly disposed in the opening. The bracket assembly may include a bracket body that includes a through hole aligned with the opening. The bracket assembly may further include a membrane embedded in the bracket body and at least partially blocking the through hole. In this regard, the membrane may define a seal that prevents liquid ingress from passing through the through hole and entering the internal region.

In another aspect, a method for assembling a bracket assembly is described. The method may include molding a membrane support to a membrane in a first molding tool to define a membrane assembly. The method may further include molding a bracket body to the membrane assembly. The bracket body may include a through hole. In some embodiments, the membrane may define a seal to prevent an ingress liquid from passing through the through hole while allowing air to pass through the through hole.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with some described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The described embodiments relate to a membrane, or seal, in an electronic device. The membrane is designed to enhance liquid-resistance capabilities of the electronic device in order to prevent liquid ingress (such as water ingress) from entering an opening of the electronic device. In this regard, the membrane is positioned in the opening to provide a liquid barrier for the electronic device. The membrane may also be designed as an air-permeable membrane that allows air to pass into and out of the opening. In some cases, the membrane includes polytetrafluoroethylene ("PTFE"). Further, in some cases, the membrane includes a stretched PTFE, causing the membrane to include small pores of varying sizes. Having an air-permeable, liquid-resistant membrane, the electronic device may include an operational component that relies on the opening for air transmission. Moreover, the operational component is protected from liquid ingress via the membrane. As non-limiting examples, the operational component may include an audio driver (audio speaker) that transmits audible sound through the opening and the membrane, a microphone or a barometric (pressure) sensor, each of which includes an electronic component and relies upon airflow.

In order to physically protect the membrane, the membrane may be part of a bracket assembly installed in the electronic device. One or more molding operations may be used to form the bracket assembly. For example, the membrane may undergo a molding operation to mold a membrane support to the membrane, thereby forming a membrane assembly. The membrane support may include an elastomeric material, such as rubber or elastomer. The membrane assembly may undergo a molding operation to mold a bracket body to the membrane assembly, and in particular, to the membrane support. The bracket body may include a polymeric material, such as plastic. The bracket body may also include a channel, or through hole, that is at least partially blocked by the membrane. When installed in the electronic device, the channel may align with the opening of the electronic device such that the membrane is positioned to block liquid entering the opening of the electronic device, thereby prevent the liquid from extending into the electronic device.

Molding operations may include compression molding, insert molding, and/or over molding. Also, one or more of these molding operations used to mold the bracket body may subject the membrane assembly to a relatively high pressure and temperature. However, the membrane support may act as a buffer between the bracket body, or molding thereof, and the membrane. As such, the membrane support may compress based on the increased pressure during the molding operation, and may also absorb increased temperatures during the molding operation. In this manner, the membrane support shields the membrane, and the membrane is less susceptible to damage during formation of the bracket body. This may lead to a more reliable membrane.

Also, in some cases, the molding operation of the bracket body includes mixing two or more chemicals that combine to form an epoxy, or resin. The formation by epoxy may include a molding operation that subjects the membrane to reduced temperature and pressure, relative to the molding operation using the polymeric material. In this manner, the membrane support may not be required as the membrane is not subject to the increased temperature and pressure.

In some cases, the enclosure of the electronic device is formed from a metal, such as aluminum (or aluminum alloy), or steel (including stainless steel). However, in some cases, the enclosure is formed by a molding operation similar to that previously described. Regarding the latter, the enclosure may be molded over the membrane such that the enclosure includes an opening that is at least partially blocked by the membrane. Accordingly, the membrane may be embedded in the enclosure during formation of the enclosure.

These and other embodiments are discussed below with reference to FIGS. 1-17. However, those skilled in the art will readily appreciate that the detailed description given herein with respect to these Figures is for explanatory purposes only and should not be construed as limiting.

Figure 1:
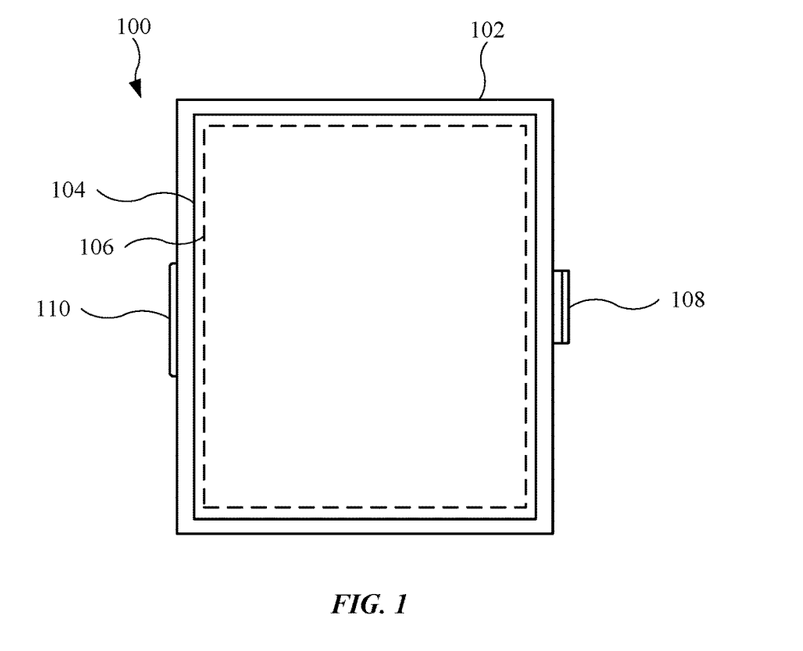
FIG. 1 illustrates a front view of an embodiment of an electronic device, in accordance with the descried embodiments.

FIG. 1 illustrates a front view of an embodiment of an electronic device 100, in accordance with some described embodiments. In some embodiments, the electronic device 100 is a tablet device. In other embodiments, the electronic device 100 is a mobile wireless communication device, such as a smartphone. In some embodiments, the electronic device 100 is a wearable electronic device, similar to a watch. However, the electronic device 100 may include wireless communication capabilities, similar to previously described embodiments of an electronic device. As shown, the electronic device 100 may include an enclosure 102. In some embodiments, the enclosure 102 is formed from a metal, which may include aluminum or stainless steel. In other embodiments, the enclosure 102 includes a metal alloy. Further, in some embodiments, the enclosure 102 includes a non-metal, such as ceramic. As shown, the enclosure 102 may include several sidewalls that combine to form an internal region (not shown) that receives several operational components for the electronic device 100.

The electronic device 100 may further include a protective layer 104 secured with the enclosure 102. The protective layer 104 may overlay a display assembly 106 (shown as a dotted line) designed to present visual content. In some embodiments, the protective layer 104 includes glass. In other embodiments, the protective layer 104 includes sapphire. The protective layer 104 may generally be any material that provides a protective and transparent cover for the display assembly 106. Also, the display assembly 106 may include a touch-sensitive display designed to respond to a capacitive coupling with a touch-sensitive layer (not shown) of the display assembly 106.

Also, the electronic device 100 may include one or more input features, such as a first input feature 108 and a second input feature 110. The first input feature 108 and/or the second input feature 110 may include a dial designed to rotate in response to a rotational force. The first input feature 108 and/or the second input feature 110 may include a button designed to actuate in a direction toward the enclosure 102 in response to a force. The first input feature 108 and/or the second input feature 110 may be used to generate an input to or command to a processor circuit (not shown) in the electronic device 100. In response to the input or command, the processor circuit may use an executable program stored on a memory circuit (not shown) to change the visual content displayed on the display assembly 106. Also, the electronic device 100 may include one or more radio circuits (not shown) allowing the electronic device 100 to connect to a network as well as pair with an additional electronic device, such as a wireless communication device.

Also, although not shown, when the electronic device 100 is a wearable electronic device, the electronic device 100 may include one or more bands that wrap around an appendage (a wrist, for example) of a user. Also, the enclosure 102 may include cavities or partial openings to receive and mechanically interlock with bands, with the cavities allowing for the removal and replacement of the bands with different bands.

Figure 2:
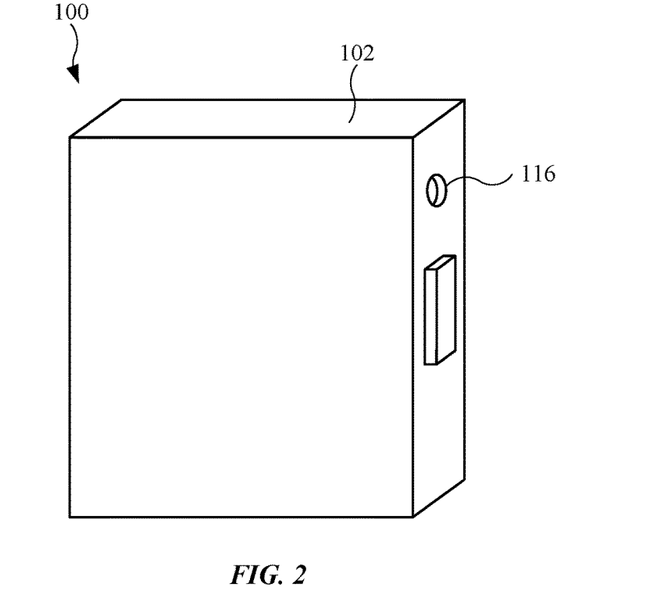
FIG. 2 illustrates a rear isometric view of the electronic device shown in FIG. 1.

FIG. 2 illustrates a rear isometric view of the electronic device shown in FIG. 1, showing an opening 116 in the enclosure 102. The opening 116 may serve several purposes. For example, the opening 116 may allow for emission of acoustical energy in the form of audible sound from an audio driver (or audio speaker) disposed in the electronic device 100. The opening 116 may be used with other operational components, such as a microphone and/or a barometric (pressure) sensor. Moreover, the enclosure 102 may include additional openings (not shown) for the aforementioned operational components. Further, the openings may be disposed along various locations of the enclosure 102 based in part on a location of the operational component(s). Also, the openings may vary in size and shape. Further, the number of openings may vary according to the functionality of the electronic device 100. For example, an additional opening (not shown) may be used in conjunction with the opening 116 to enhance the audible sound from the audio driver.

In some embodiments, the opening 116 (or an additional opening) is used as a vent for the electronic device 100 to allow air to flow into and/or out of the electronic device 100. For example, the electronic device 100 may be subject to an elevation change that results in a pressure change at the electronic device 100 that causes airflow into or out of the electronic device 100 based on a pressure increase or pressure decrease, respectively. Accordingly, the opening 116 may allow the electronic device 100 to response to pressure changes by allowing the pressure inside the electronic device 100 to adjust and equilibrate with ambient pressure (outside the electronic device 100), which may prevent damage to the electronic device 100. Further, the electronic device 100 may include a barometric sensor that uses the opening 116 (or an additional opening) to detect pressure exerted on the electronic device 100, and provide a measurement of pressure exerted on the electronic device 100.

Figure 3:
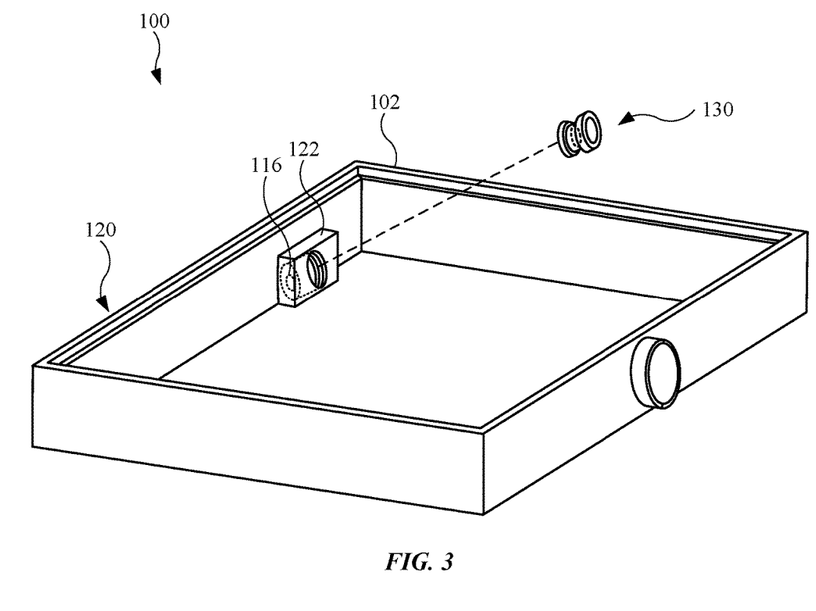
FIG. 3 illustrates a partial isometric view of the electronic device shown in FIG. 1, showing an interior region of the enclosure and a bracket assembly prior to assembly with the enclosure.

FIG. 3 illustrates a partial isometric view of the electronic device 100 shown in FIG. 1, showing an internal region 120 of the enclosure 102 and a bracket assembly 130 prior to assembly with the enclosure 102. The protective layer 104 and the display assembly 106 (shown in FIG. 1), along with several internal components (such as battery, processor circuit, memory circuit, audio driver/speaker) are removed for purposes of illustration and simplicity. When installed, the bracket assembly 130 positioned in the opening 116 to limit or prevent ingress of liquid into the electronic device 100 via the opening 116. However, the bracket assembly 130 may be designed to allow air to pass into and out of the enclosure 102. In this regard, the bracket assembly 130 may include a membrane (not shown) that is both air-permeable and liquid-resistant. This may prevent any liquid passing partially through the opening 116 from further extending through the opening 116 and into the internal region 120. This will be shown and described in further detail below.

As shown, the enclosure 102 may include a compartment 122 used to receive the bracket assembly 130. The compartment 122 may be integrally formed with the enclosure 102 such that enclosure 102 and the compartment 122 combine to form a unitary structure, such as a single substrate of material. In some embodiments, the compartment 122 and the bracket assembly 130 include threaded regions such that the bracket assembly 130 may be in threaded engagement with the compartment 122. In some embodiments (not shown), the enclosure 102 includes a threaded region for threaded engagement with the bracket assembly 130, and the compartment 122 is not required.

Figure 4:
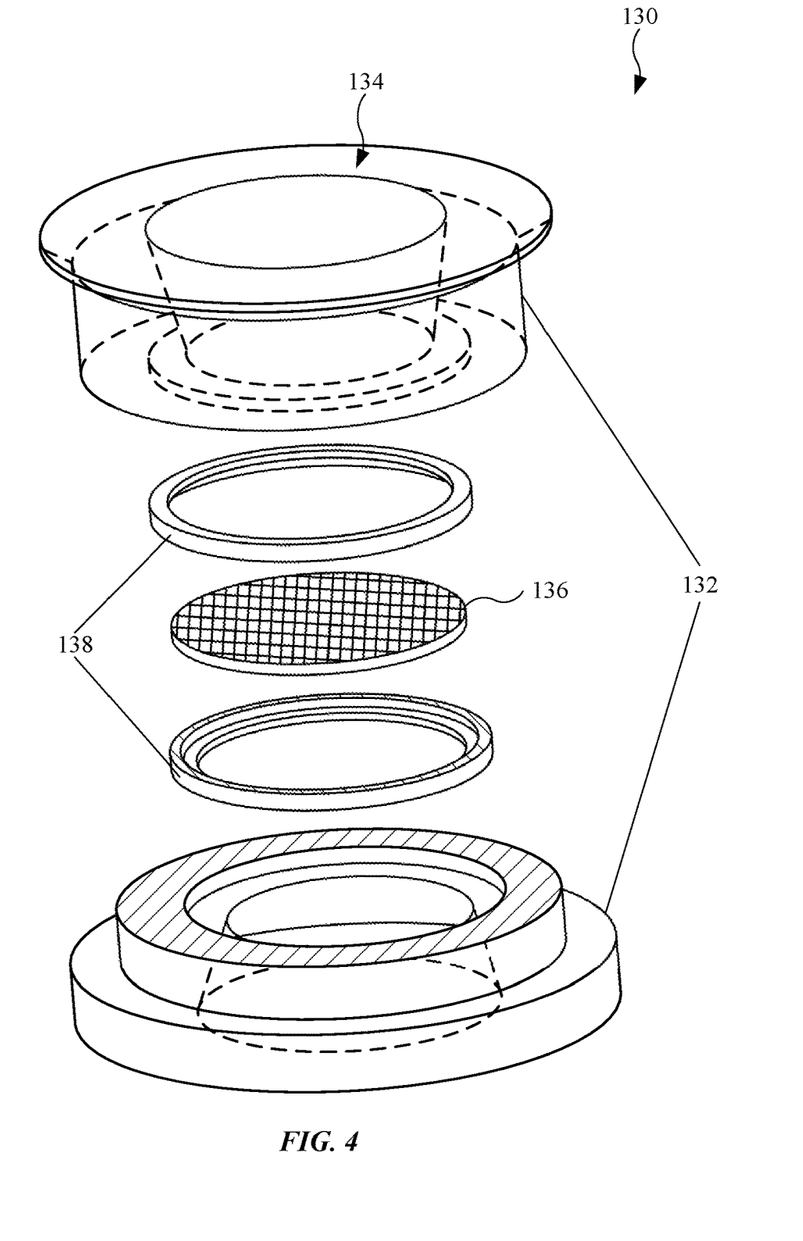
FIG. 4 illustrates an exploded view of the bracket assembly shown in FIG. 3.

FIG. 4 illustrates an exploded view of the bracket assembly 130 shown in FIG. 3. Several structural features may be shown as a partial cross sectional view for purposes of illustration. However, it should be noted that these features shown as a partial cross section may be a single, unitary piece. Further, these structural elements shown as a partial cross section can be formed by one of several molding operations, shown and described below.

As shown in FIG. 4, the bracket assembly 130 includes a bracket body 132 shown as a partial cross sectional view. In some embodiments, the bracket body 132 is formed from a polymeric material, such as plastic. In other embodiments, bracket body 132 is formed from an epoxy. In either embodiment, the bracket body 132 may be formed by a molding operation. The bracket body 132 may include a channel 134 that extends through the bracket body 132 from end to end (of the bracket body 132). In this regard, the channel 134 may be referred to as a through hole. The bracket body 132, as shown, includes a particular size and shape. However, the size and the shape of the bracket body 132 may change according to other constraints, such as the size and the shape of the enclosure 102 and/or the opening 116 (shown in FIG. 3). Accordingly, the size and the shape of the bracket body 132 may vary according the size and the shape of an embodiment of an electronic device 100.

The bracket assembly 130 may further include a membrane 136 secured with the bracket body 132. In some embodiments, the membrane 136 includes PTFE, which may include a stretched PTFE. Generally, the membrane 136 may include any material that is air-permeable and also liquid-resistant. In other words, the membrane 136 may include a material that allows air to pass through membrane 136 but also blocks liquids from passing through the membrane 136. As shown in FIG. 4, the membrane 136 may be positioned in the channel 134 to form a barrier in the channel 134. In particular, the membrane 136 may allow air to pass completely through the channel 134, while also preventing liquids from passing completely through the channel 134.

The bracket assembly 130 may further include a membrane support 138 surrounding the membrane 136. The membrane support 138 is shown as a partial cross section. As shown in FIG. 4, the membrane support 138 may surround an edge region, or outer periphery, of the membrane 136, while remaining free from a central region (other than the edge region) of the membrane 136. The membrane support 138 and the membrane 136 may combine to define a membrane assembly embedded in the bracket body 132. In some embodiments, the membrane support 138 includes an elastomer. In the embodiment shown in FIG. 4, the membrane support 138 includes rubber. Generally, the membrane support 138 may be formed from any compressible material that also withstands increased temperature and pressure associated with a molding operation to form the bracket body 132. In this regard, the membrane support 138 may act as a buffer between the bracket body 132 and the membrane 136 to limit or prevent damage and/or deformation (such as wrinkling) of the membrane 136 during a molding operation (or in some cases, as assembly operation). This will be further discussed below. Also, although not shown, the bracket assembly 130 may further include a seal (such as a compressible O-ring) that surrounds the bracket body 132. The seal may be designed to engage an enclosure of an electronic device (such as the enclosure 102, shown in FIG. 3) to further seal the electronic device from ingress and to secure the bracket assembly 130 with the enclosure.

Figure 5:
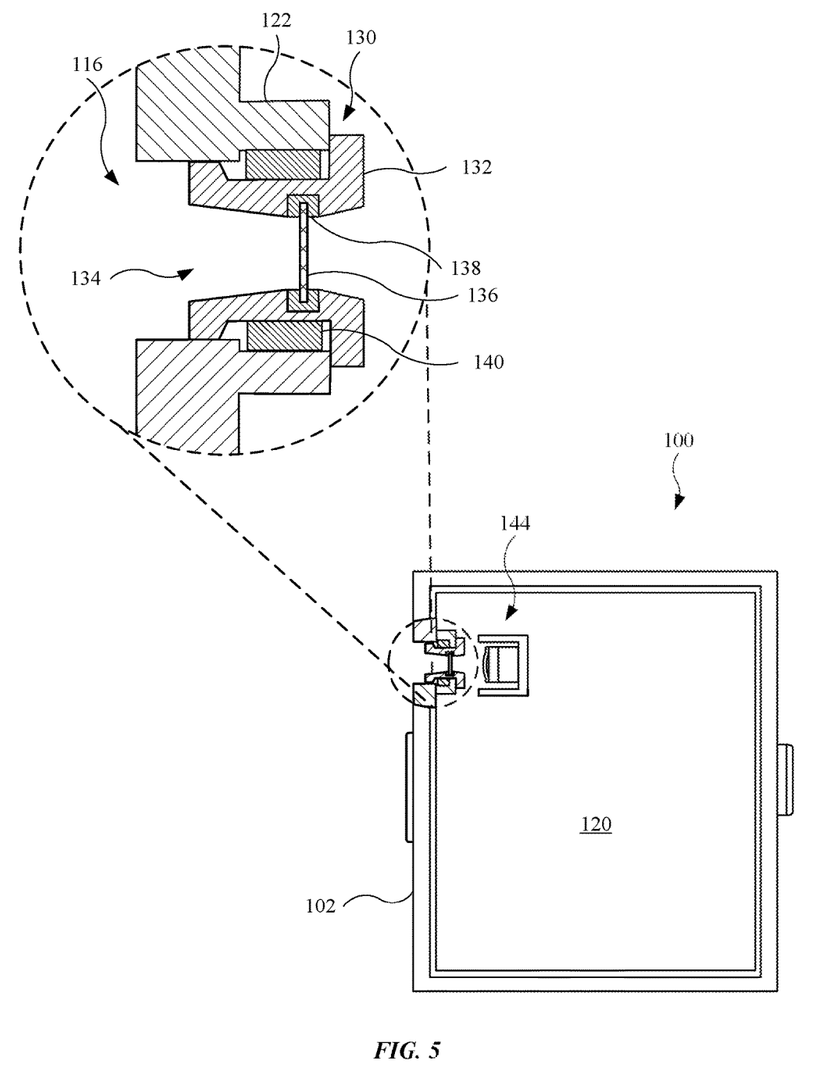
FIG. 5 illustrates an enlarged front view of the electronic device shown in FIG. 3, further showing the bracket assembly installed in the enclosure.

FIG. 5 illustrates an enlarged front view of the electronic device 100 shown in FIG. 3, further showing the bracket assembly 130 installed in the enclosure 102. As shown in the enlarged view, the bracket body 132, and in particular, the channel 134, may be aligned, and in some cases concentric, with the opening 116 of the enclosure 102. Also, the membrane 136 may be positioned in the channel 134 to form a barrier in the channel 134. In this manner, the membrane 136 may prevent, for example, liquid (such as water or a water-based solution) that enters the opening 116 and partially enters the channel 134 from further passing through the enclosure 102 and/or the channel 134. Also, the membrane support 138 may further add structural support to the membrane 136. The bracket assembly 130 may further include a sealing element 140 (such as a compressible O-ring) that surrounds the bracket body 132 and engages the enclosure 102 (or the compartment 122) to further seal the electronic device 100 from ingress that passes around the bracket assembly 130, and to secure the bracket assembly 130 with the enclosure 102.

Also, the electronic device 100 may include an operational component 144 disposed in the internal region 120. In some embodiments, the operational component 144 is a barometric (pressure) sensor designed to measure pressure exerted on the electronic device 100. In some embodiments, the operational component 144 is a microphone designed to receive audible sound from a user of the electronic device 100. In the embodiment shown in FIG. 4, the operational component 144 is an audio driver designed to emit audible sound. The operational component 144 may rely on ambient air (external to the electronic device 100) for functionality and may also be sensitive to liquid ingress. In this regard, the membrane 136, being an air-permeable and liquid-resistant membrane, may allow air to pass to and from the operational component 144, while also shielding the operational component 144 from liquid ingress. Also, although not shown, an acoustic (or cosmetic) mesh may be disposed in the opening 116 to hide the bracket assembly 130.

FIGS. 6-9 illustrate a process for forming a bracket assembly, in accordance with some described embodiments. The features and processes shown and described in FIGS. 6-9 may be used to form the bracket assembly 130 (shown in FIGS. 3-5). Further, the materials used to form the bracket assembly 130 shown in FIGS. 3-5 may also be used in the processes shown and described in FIGS. 6-9.

Figure 6:
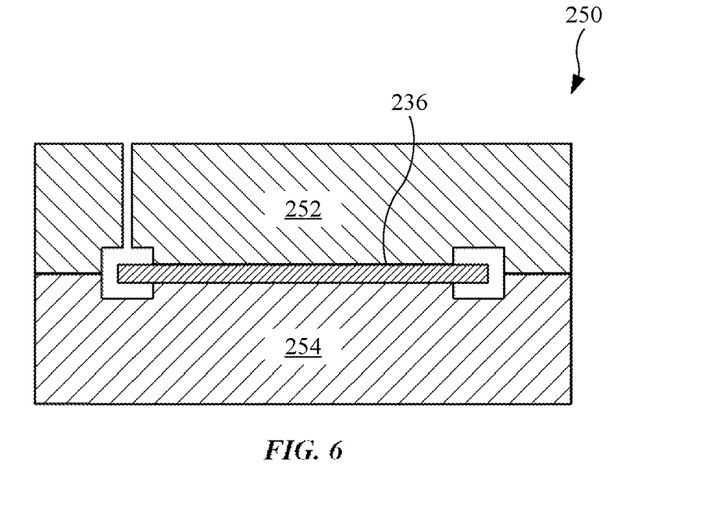
FIG. 6 illustrates a cross sectional view of an embodiment of a membrane disposed in a molding tool.

FIG. 6 illustrates a cross sectional view of an embodiment of a membrane 236 disposed in a molding tool 250. The molding tool 250 may be suitable for molding operations, such as a compression molding operation, an over molding operation, or an injection molding operation, as non-limiting examples. As shown, the molding tool 250 may include a first mold member 252 and a second mold member 254. Although not shown, the molding tool 250 may include various configurations. The first mold member 252 and the second mold member 254 may be designed to accommodate the membrane 236. Also, the first mold member 252 and the second mold member 254 may include cavities to receive a material, thereby allowing the material to mold with the membrane 236. Although shown as a cross sectional view, the membrane 236 as well as the cavities in the first mold member 252 and the second mold member 254 may include a circular, cylindrical, or circumferential shape. Although not shown, various multi-sided shapes are also possible.

Figure 7:
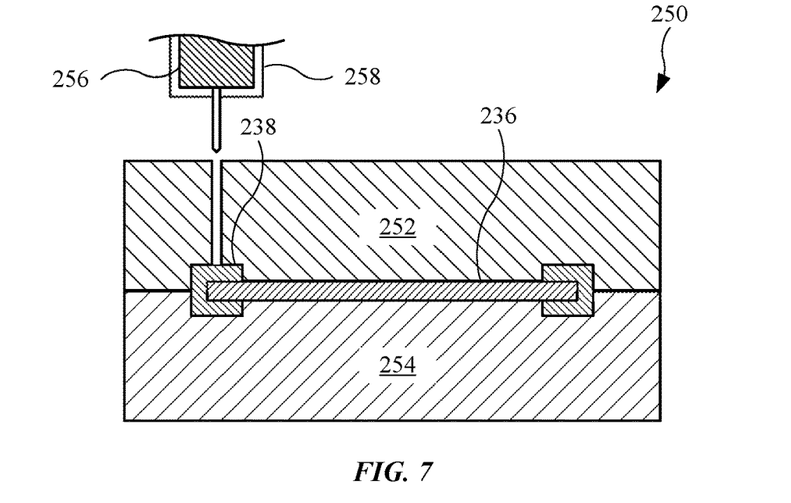
FIG. 7 illustrates a cross sectional view of the membrane and the molding tool shown in FIG. 6, further showing the molding tool receiving a material to mold a membrane support to the membrane, in accordance with some described embodiments.

FIG. 7 illustrates a cross sectional view of the membrane 236 and the molding tool 250 shown in FIG. 6, further showing the molding tool 250 receiving a material 256 to mold a membrane support 238 to the membrane 236, in accordance with some described embodiments. A dispenser 258 may supply the material 256 into the molding tool 250. As shown in FIG. 7, the cavities of the first mold member 252 and the second mold member 254 allow the material 256 to extend around an edge region of the membrane 236 to form the membrane support 238, and define a membrane assembly.

Figure 8:
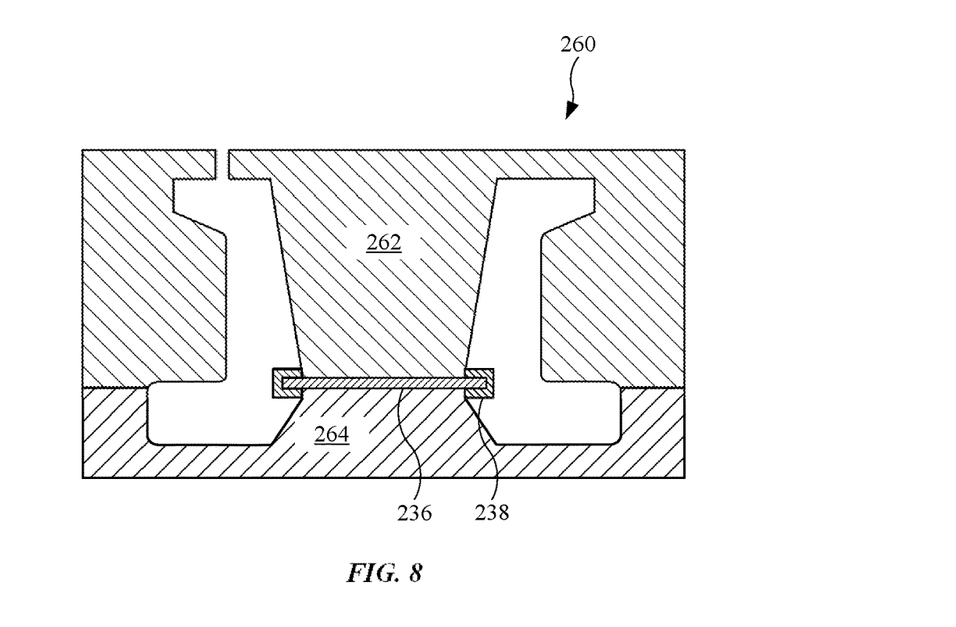
FIG. 8 illustrates a cross sectional view of the membrane and the membrane support shown in FIG. 7, with the membrane and the membrane support disposed in a second molding tool.

FIG. 8 illustrates a cross sectional view of the membrane 236 and the membrane support 238 shown in FIG. 7, with the membrane 236 and the membrane support 238 disposed in a second molding tool 260. The second molding tool 260 may be suitable for molding operations, such as a compression molding operation, an over molding operation, or an injection molding operation. As shown, the second molding tool 260 may include a first mold member 262 and a second mold member 264. Although not shown, the second molding tool 260 may include various configurations. The first mold member 262 and the second mold member 264 may be designed to accommodate the membrane 236 and the membrane support 238. Also, the first mold member 262 and the second mold member 264 may include cavities to receive a material, thereby allowing the material to mold with the membrane 236 and the membrane support 238. Although shown as a cross sectional view, the cavities in the first mold member 262 and the second mold member 264 may include a circular, cylindrical, or circumferential shape. However, various multi-sided shapes are also possible.

Figure 9:
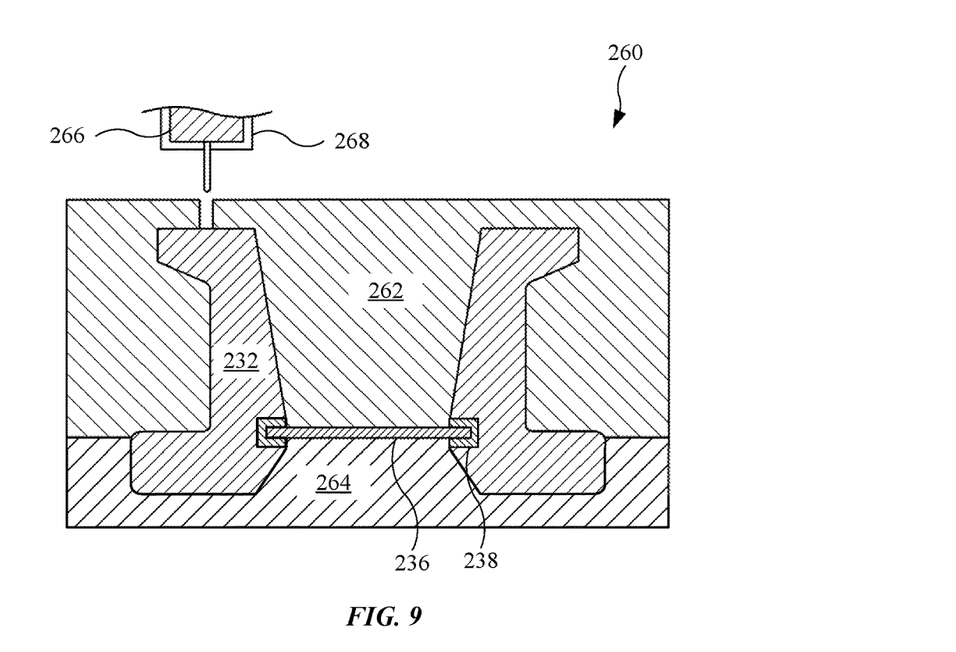
FIG. 9 illustrates a cross sectional view of the membrane, the membrane support, and the second molding tool shown in FIG. 8, further showing the second molding tool receiving a material to mold a bracket body to the membrane support, in accordance with some described embodiments.

FIG. 9 illustrates a cross sectional view of the membrane 236, the membrane support 238, and the second molding tool 260 shown in FIG. 8, further showing the second molding tool 260 receiving a material 266 to mold a bracket body 232 to the membrane support 238, in accordance with some described embodiments. A dispenser 268 may supply the material 266 into the molding tool 250. The cavities of the first mold member 262 and the second mold member 264 allow the material 266 to extend around and mold to the membrane support 238, as shown in FIG. 8, to define the bracket body 232.

During the molding operation, the material 266 may be applied at relatively high temperatures. Further, when the molding operation includes, for example, a compression molding operation, the molding operation may provide pressure to the material 266 in order to extend the material 266 throughout the cavities of the first mold member 262 and the second mold member 264. However, the membrane support 238 may provide a buffer such that the membrane support 238, rather than the membrane 236, absorbs the increased temperature and pressure during the molding operation and provides a temperature and pressure shield for the membrane 236. Accordingly, the membrane support 238 may prevent the bracket body 232 from contacting the membrane 236. In this regard, the membrane 236 may less susceptible to damage or wrinkling during a molding operation.

Figure 10:
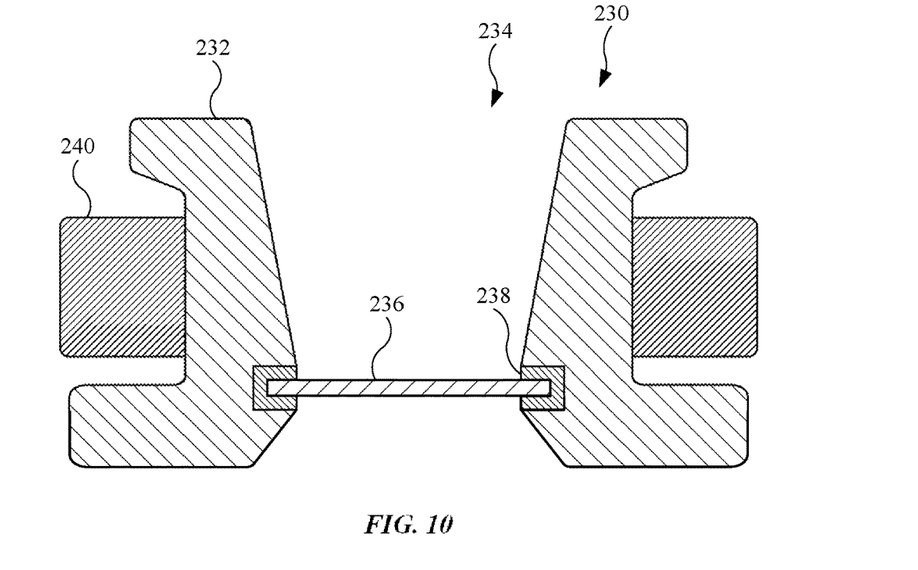
FIG. 10 illustrates a cross sectional view of the membrane, the membrane support, and the bracket body removed from the second molding tool (shown in FIG. 9)

FIG. 10 illustrates a cross sectional view of the membrane 236, the membrane support 238, and the bracket body 232 removed from the second molding tool 260 (shown in FIG. 9). These structural features may combine to define a bracket assembly 230, in accordance with some described embodiments. Also, as shown, the molding operation may define a channel 234, or through hole, in the bracket body 232 that extends through the bracket body 232 end to end. However, the membrane 236 may form a barrier in the channel 234 to prevent liquid from passing completely through the channel 234. Also, the bracket assembly 230 may further include a sealing element 240 (such as an O-ring) that extends around the bracket body 232. In some embodiments, as shown in FIG. 10, the sealing element 240 extends radially outward beyond the bracket body 232. However, in some embodiments (not shown), the bracket body 232 may extend radially beyond the sealing element 240.

FIGS. 11-15 illustrate various alternative designs to a bracket assembly. However, although not shown, in some cases, at least some features shown and described in the embodiments shown in FIGS. 11-15 may be incorporated into previous embodiments, and features shown and described in previous embodiments may be incorporated into the embodiments shown in FIGS. 11-15. Also, although cross sectional views are shown in FIGS. 11-15, the embodiments may include circular, cylindrical, or circumferential designs.

Figure 11:
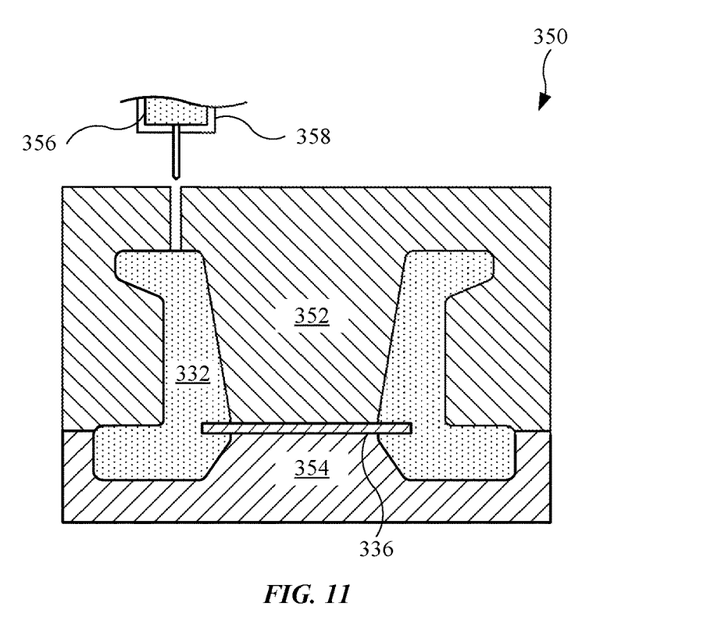
FIG. 11 illustrates a cross sectional view of an alternate embodiment of a material received by a molding tool to mold a bracket body.

A bracket assembly may be formed from different materials, and as such, may alter the formation process. For example, FIG. 11 illustrates a cross sectional view of an alternate embodiment of a material 356 received by a molding tool 350 to mold a bracket body 332 with a membrane 336. The material 356 may include an epoxy form by combining two or more chemical compounds that form a reaction to cure the material 356. In this manner, the molding operation may provide less pressure and a lower temperature, thereby reducing the pressure and temperature exerted on the membrane 336. In this regard, the molding tool 350 may be suitable to simply create a cast that defines the bracket body 332. As shown, the molding tool 350 may include a first mold member 352 and a second mold member 354. Although not shown, the molding tool 350 may include various configurations. The first mold member 352 and the second mold member 354 may be designed to accommodate the membrane 336. Also, a dispenser 358 may supply the material 356 into the molding tool 350. The dispenser 358 may include two or more materials that combine to form an epoxy (or resin) that fills the molding tool 350. The epoxy may allow for a molding operation with lower temperatures and pressures, as compared to the previously described molding operation for a bracket body 232 (shown in FIG. 9). The cavities of the first mold member 352 and the second mold member 354 allow the material 356 to extend around an edge region of the membrane 336. Also, based on the relatively low temperatures and pressures of the material 356, the bracket body 332 may be in direct contact with the membrane 336.

Figure 12:
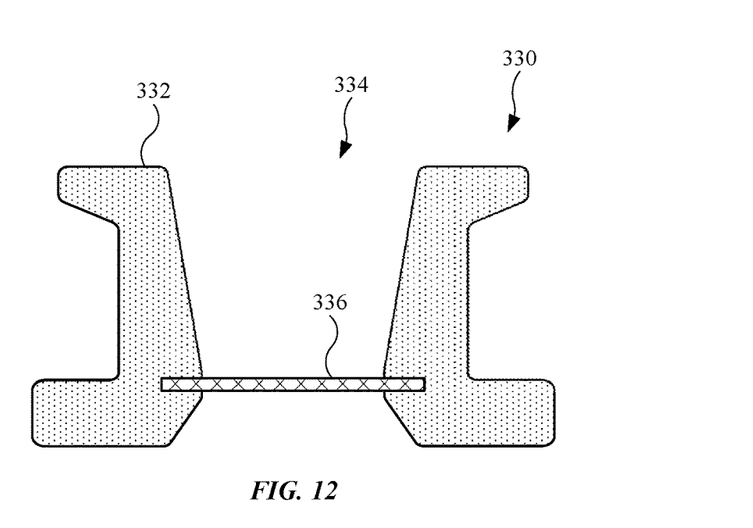
FIG. 12 illustrates a cross sectional view of the membrane and the bracket body removed from the molding tool shown in FIG. 11.

FIG. 12 illustrates a cross sectional view of the membrane 336 and the bracket body 332 removed from the molding tool 350 (shown in FIG. 11). The bracket body 332 and the membrane 336 may define a bracket assembly 330 that requires fewer parts, as a membrane support (shown in previous embodiments) is not required to provide a buffer for the membrane 336. While an epoxy is used to form the bracket body 332 shown in FIG. 12, other liquid-based materials that cure without substantially increased temperature and pressure may be used. Also, similar to previous embodiments, the bracket assembly 330 may include a channel 334 that extends through the bracket body 332, with the membrane 336 forming a barrier in the channel 334. In this manner, the bracket assembly 330 may include air-permeable, liquid-resistant characteristics based on the membrane 336.

Figure 13:
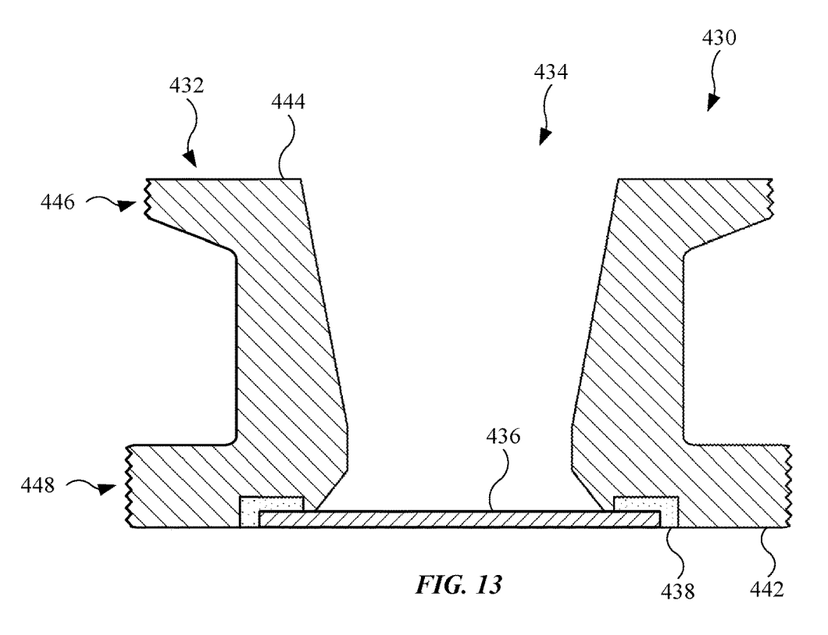
FIG. 13 illustrates a cross sectional view of an alternate embodiment of a bracket assembly, showing a membrane secured with an end of a bracket body, in accordance with some described embodiments.

FIG. 13 illustrates a cross sectional view of an alternate embodiment of a bracket assembly 430, showing a membrane 436 secured with a first end 442 of a bracket body 432, in accordance with some described embodiments. In some embodiments, the first end 442 is associated with an interior region of the bracket assembly 430 and a second end 444 (opposite the first end 442) is associated with an exterior region of the bracket assembly 430. In this manner, the second end 444 may abut an enclosure of an electronic device (previously described) and align with an exterior surface of the enclosure, while the first end 442 is off separated from the exterior surface. Also, the membrane 436 may be adhesively secured with the bracket body 432 by an adhesive 438. Further, the bracket body 432 may include a cavity to receive the membrane 436 such that the membrane 436 is co-planar, or flush, with respect to the first end 442. In some cases, when the bracket body 432 is formed from a molding operation that includes relatively high temperatures and pressures, the membrane 436 may be assembled with the bracket body 432 subsequent to the molding operation. Also, similar to previous embodiments, the bracket assembly 430 may include a channel 434 that extends through the bracket body 432, with the membrane 436 forming a barrier in the channel 434. In this manner, the bracket assembly 430 may include air-permeable, liquid-resistant characteristics based on the membrane 436.

In addition, FIG. 13 illustrates threaded regions of the bracket body 432. For example, in some embodiments, the bracket body 432 includes a first threaded region 446. In the embodiment shown in FIG. 13, the bracket body 432 includes a first threaded region 446 and a second threaded region 448. Both the first threaded region 446 and the second threaded region 448 may extend circumferentially around the bracket body 432. This may allow installation of the bracket assembly 430 by a threaded engagement between a threaded region (not shown) of an enclosure of an electronic device and both the first threaded region 446 and the second threaded region 448.

Figure 14:
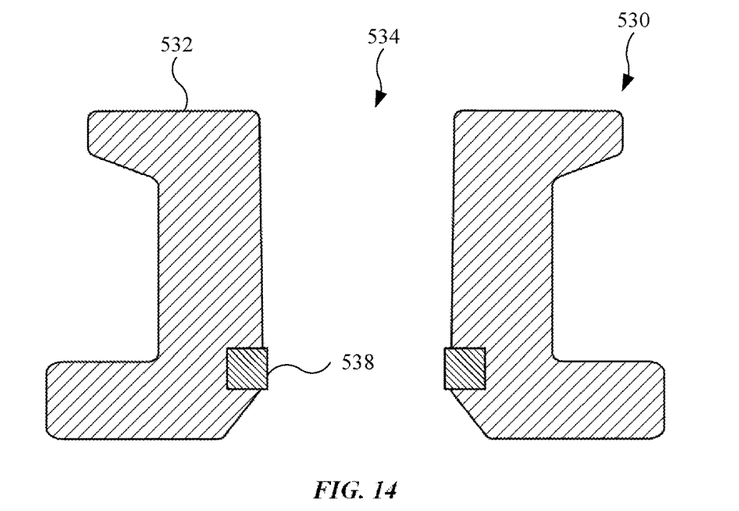
FIG. 14 illustrates a partial cross sectional view of an alternate embodiment of a bracket assembly that includes a sealing element partially disposed in a bracket body, in accordance with some described embodiments.

FIG. 14 illustrates a partial cross sectional view of an alternate embodiment of a bracket assembly 530 that includes a sealing element 538 partially disposed in a bracket body 532, in accordance with some described embodiments. The sealing element 538 may be embedded circumferentially in the bracket body 532 by a molding operation (not shown). However, bracket assembly 530 may include a channel 534 that defines a port (or at least part of a port) of an electronic device (not shown), with the port designed to receive an external device, such as an audio jack, a data transfer cable, or a power cable. When any one of these the structural features enters the bracket assembly 530, the structural feature may engage sealing element 538, creating a liquid-resistant seal that prevents liquid ingress through the bracket assembly 530. Accordingly, the bracket assembly 530 may include liquid-resistant characteristics without using a membrane (shown in previous embodiments).

Figure 15:
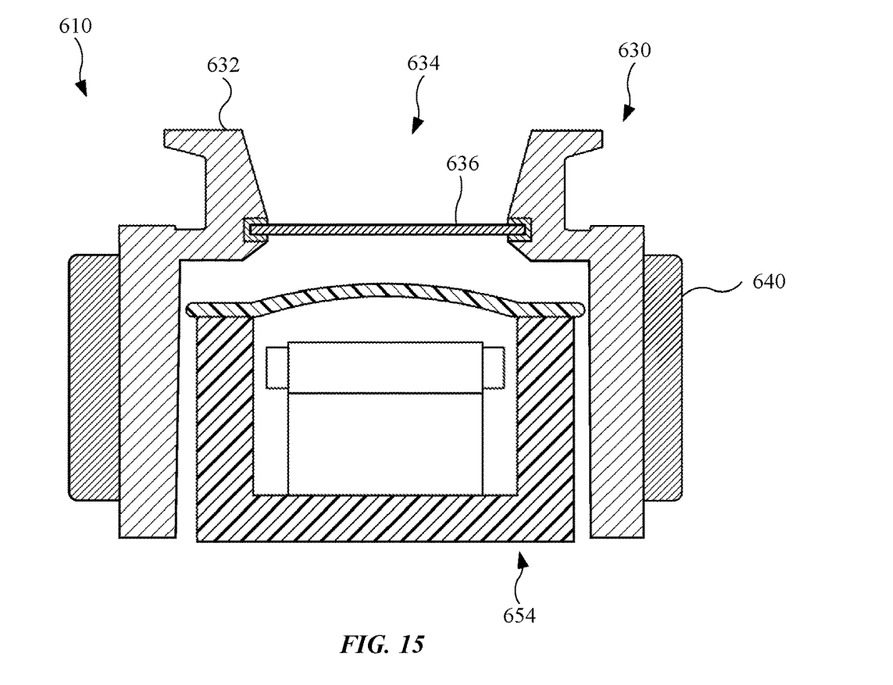
FIG. 15 illustrates an isometric view of an alternate embodiment of an assembly that incorporates a bracket assembly with an operational component, in accordance with some described embodiments.

FIG. 15 illustrates an isometric view of an alternate embodiment of an assembly 610 that incorporates a bracket assembly 630 with an operational component 654, in accordance with some described embodiments. The operational component 654 may include any operational component previously described. As shown, the assembly 610 may incorporate the operational component 654 with the bracket assembly 630 to facilitate assembly into an electronic device (not shown). For example, a bracket body 632 of the bracket assembly 630 may include a size and a shape to receive the operational component 654. Accordingly, the bracket body 632 may define a housing for the operational component 654. In this manner, installing the assembly 610 may include a single step as opposed to multiple steps of installing the bracket assembly 630 and (separately) installing the operational component 654. As shown, the operational component 654 may include an audio driver that passes acoustical energy in the form of audible sound through a channel 634 as well as a membrane 636, while the membrane 636 may shield the operational component 654 from liquid ingress. Also, the assembly 610 may include a sealing element 640 to provide additional protection from liquid ingress passing around the assembly 610.

Figure 16:
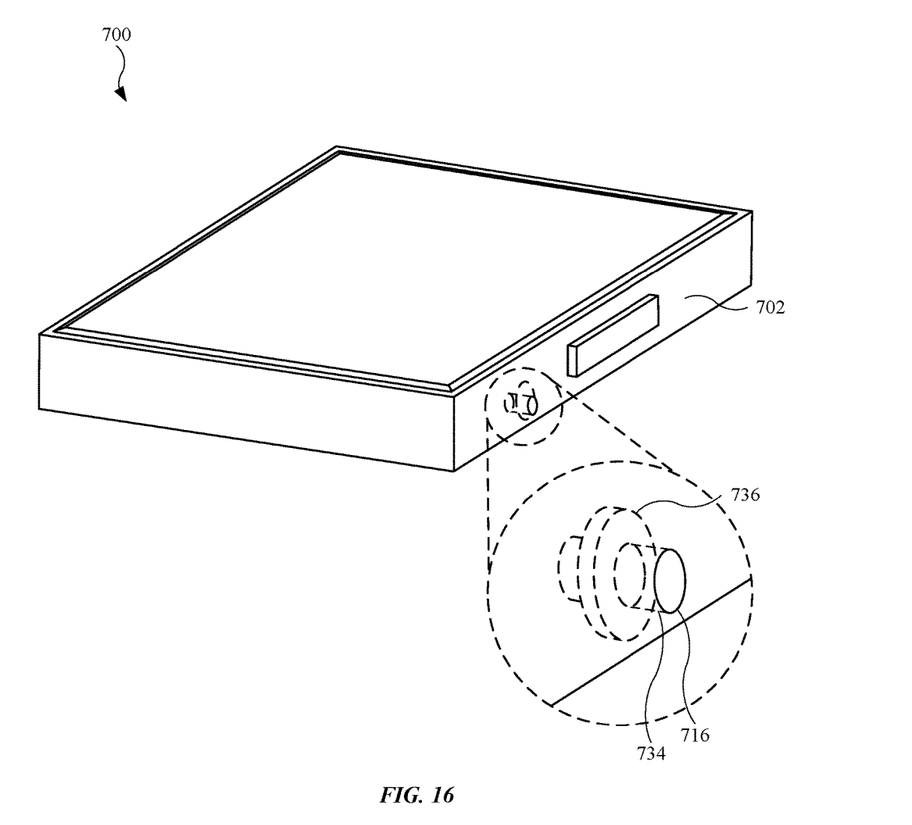
FIG. 16 illustrates a partial isometric view of an alternate embodiment of an electronic device, showing an enclosure with a membrane embedded in the enclosure.

FIG. 16 illustrates a partial isometric view of an alternate embodiment of an electronic device 700, showing an enclosure 702 with a membrane 736 embedded in the enclosure 702, in accordance with some described embodiments. The membrane 736 may include any feature or features previously described for a membrane. In some embodiments, the enclosure 702 includes a moldable polymeric material. In this regard, in some embodiments, the enclosure 702 undergoes a molding operation using a molding tool (not shown). The molding tool may be designed to receive the membrane 736. Then, the molding tool may receive a material used to form the enclosure 702 and mold the enclosure 702 over the membrane 736. In the enlarged view, the enclosure 702 may include an opening 716 defining a channel 734 that is at least partially blocked by the membrane 736. The opening 716 may otherwise pass through the enclosure 702. Accordingly, the channel 734 may define a hollow region of the enclosure 702 formed during the molding operation. The opening 716 may be used by an operational component (not shown) disposed in the enclosure 702, while the membrane 736 offers an air-permeable and liquid-resistant membrane. Also, it should be understood that a material used to form the enclosure 702 should be selected so as to not cause damage to the membrane 736 during the molding operation. As shown, the enclosure 702, already having the membrane 736, may not require additional liquid-resistant modifications based on the membrane 736.

Figure 17:
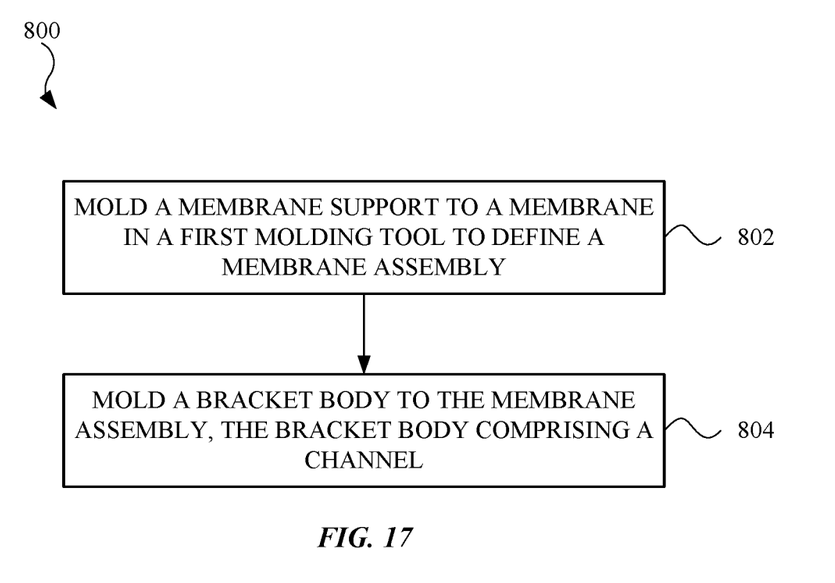
FIG. 17 illustrates a flowchart showing a method for assembling a bracket assembly, in accordance with some described embodiments.

FIG. 17 illustrates a flowchart 800 showing a method for assembling a bracket assembly, in accordance with some described embodiments. In step 802, a membrane support is molded to a membrane in a first molding tool to define a membrane assembly. The membrane may be placed in a molding tool to undergo a molding operation. The membrane support may include a rubber or elastomeric material, or another compressible material. The membrane may be an air-permeable and liquid-resistant membrane.

In step 804, a bracket body to the membrane assembly. The bracket body may include a polymer, or polymeric material, such as plastic. The membrane assembly may be placed in a second molding tool to undergo a molding operation that defines the bracket body. The bracket body may include a channel. The channel may extend through the bracket body, but may be at least partially blocked by the membrane. Once assembled, the membrane may define a seal to prevent an ingress liquid from passing entirely through the channel while allowing air to pass through the membrane and the channel. The bracket assembly may be used in an electronic device to prevent liquid ingress into an opening of the electronic device.

Other features may be included. For example, a sealing element (such as an O-ring) may be positioned around the bracket body. Also, the bracket body may include a threaded region for threaded engagement with the enclosure, or a feature in an interior region of the enclosure.

While several embodiments show a wearable electronic device, several other electronic devices may incorporate an embodiment of a bracket feature (or features) described herein. For example, a laptop computing device, a desktop computing device, a mobile wireless communication device, or a tablet device may include at least one embodiment of a bracket assembly.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A bracket assembly for preventing liquid ingress, the bracket assembly comprising:
   a bracket body comprising a through hole and a recess that surrounds the through hole;
   a membrane carried by the bracket body and at least partially sealing the through hole such that a liquid is prevented from passing through the through hole, the membrane allowing air to pass through the through hole; and
   a membrane support that defines a hollow ring coupled to an edge of the membrane, the membrane support further coupled to the bracket body and positioned within the recess.

2. The bracket assembly of claim 1, wherein the membrane support forms a buffer between the bracket body and the membrane.

3. The bracket assembly of claim 2, wherein the membrane support comprises an elastomeric material.

4. The bracket assembly of claim 1, wherein the bracket body comprises at least one of a polymeric material or polytetrafluoroethylene.

5. The bracket assembly of claim 4, wherein the membrane is free of contact with the bracket body.

6. The bracket assembly of claim 1, wherein the bracket body comprises:
   a first end having a threaded region for threaded engagement with an enclosure; and
   a second end that carries the membrane, the second end opposite the first end.

7. The bracket assembly of claim 6, wherein the bracket body comprises a cavity at the first end, and wherein the membrane is adhesively secured with the bracket body at the first end by an adhesive disposed in the cavity such that the membrane is co-planar with respect to the bracket body.

8. An electronic device, comprising:
   an enclosure comprising an internal region, the enclosure further comprising a sidewall and an opening extending through the sidewall;
   a touch-sensitive display assembly;
   a transparent cover that overlays the touch-sensitive display assembly and couples with the enclosure; and
   a bracket assembly at least partially disposed in the opening, the bracket assembly comprising:
      a bracket body comprising a through hole aligned with the opening, and
      a membrane embedded in the bracket body and at least partially blocking the through hole, the membrane defining a seal that prevents liquid ingress from passing through the through hole and entering the internal region.

9. The electronic device of claim 8, further comprising a membrane support that defines a hollow ring coupled to an edge of the membrane and embedded in the bracket body, wherein the membrane is partially embedded in the membrane support such that the membrane support defines a buffer between the bracket body and the membrane.

10. The electronic device of claim 8, further comprising a band mechanically interlocked with the enclosure, the band used to secure the enclosure, and components within the enclosure, to an appendage of a user.

11. The electronic device of claim 8, wherein the bracket body comprises a polymeric material.

12. The electronic device of claim 8, wherein the membrane allow air to pass through the through hole and into the internal region.

13. The electronic device of claim 8, further comprising a sealing element positioned around the bracket body, the sealing element pressed against the opening.

14. The electronic device of claim 8, further comprising an operational component disposed in the internal region, wherein the operational component passes audible sound through the opening, the membrane, and the through hole.

15. A method for assembling a bracket assembly, the method comprising:
    molding a membrane support to a membrane in a first molding tool to define a membrane assembly, the membrane support defining a hollow ring coupled to an edge of the membrane; and
    molding a bracket body to the membrane assembly, the bracket body comprising a through hole, wherein the membrane defines a seal to prevent an ingress liquid from passing through the through hole while allowing air to pass through the through hole, wherein molding the bracket body to the membrane assembly comprises forming a channel in the bracket body such that the through hole is at least partially blocked by the membrane.

16. The method of claim 15, wherein molding the bracket body to the membrane assembly comprises molding the bracket body only to the membrane support such that the membrane support defines a buffer between the bracket body and the membrane.

17. The method of claim 16, wherein molding the membrane support to the membrane comprises molding the membrane support only to an edge region of the membrane.

18. The method of claim 15, wherein molding the bracket body to the membrane assembly defines a recess in the bracket body, and wherein the membrane support is positioned in the recess.

19. The method of claim 15, wherein molding the bracket body to the membrane assembly comprises molding a housing for an operational component.

* * * * *